(12) United States Patent
Hiratsuka (10) Patent No.: US 11,387,514 B2
(45) Date of Patent: Jul. 12, 2022

(54) POWER SUPPLY DEVICE AND LOAD MONITOR

(71) Applicant: MIRAI-LABO KABUSHIKI KAISHA, Tokyo (JP)

(72) Inventor: Toshio Hiratsuka, Tokyo (JP)

(73) Assignee: MIRAI-LABO KABUSHIKI KAISHA, Tokyo (JP)

( * ) Notice: Subject to any disclaimer, the term of this patent is extended or adjusted under 35 U.S.C. 154(b) by 329 days.

(21) Appl. No.: 16/342,798

(22) PCT Filed: Oct. 17, 2017

(86) PCT No.: PCT/JP2017/037463
§ 371 (c)(1),
(2) Date: Jan. 13, 2020

(87) PCT Pub. No.: WO2018/074446
PCT Pub. Date: Apr. 26, 2018

(65) Prior Publication Data
US 2020/0185670 A1    Jun. 11, 2020

(30) Foreign Application Priority Data

Oct. 18, 2016 (JP) .............................. JP2016-204094

(51) Int. Cl.
*H01M 50/20* (2021.01)
*H02J 7/00* (2006.01)
(Continued)

(52) U.S. Cl.
CPC ............ *H01M 50/20* (2021.01); *G01R 19/15* (2013.01); *H01M 10/425* (2013.01);
(Continued)

(58) Field of Classification Search
CPC .... F16M 3/00; H01M 10/0525; H02J 7/0044; B60L 53/36
(Continued)

(56) References Cited

U.S. PATENT DOCUMENTS

2011/0101794 A1 * 5/2011 Schroeder ........... H01M 10/425
307/150
2011/0259953 A1 * 10/2011 Baarman ................. G01F 23/20
235/375
(Continued)

FOREIGN PATENT DOCUMENTS

| JP | 2007-115477 A | 5/2007 |
| JP | 2013-089317 A | 5/2013 |
| WO | 2014-030348 A1 | 2/2014 |

OTHER PUBLICATIONS

Nov. 28, 2017—International Search Report—Intl App PCT/JP2017/037463.

*Primary Examiner* — Daniel Cavallari
*Assistant Examiner* — Swarna N Chowdhuri
(74) *Attorney, Agent, or Firm* — Banner & Witcoff, Ltd.

(57) ABSTRACT

Aspects of the disclosure relate to making it easy to move a power supply device having a large capacity battery. A power supply device includes a carriage, an inverter, a battery and a battery mounting portion. The carriage has wheels. The inverter is supported by the carriage. The battery has a power output terminal at the lower part thereof. The battery mounting portion has a power input terminal which is connected to the inverter and contacts with the output terminal when the battery is mounted. The battery can be mounted and detached by moving vertically.

8 Claims, 9 Drawing Sheets

(51) Int. Cl.
    *G01R 19/15* (2006.01)
    *H01M 10/42* (2006.01)
    *H01M 10/48* (2006.01)
    *H02J 9/06* (2006.01)
    *H02J 3/38* (2006.01)
    *H02J 7/35* (2006.01)

(52) U.S. Cl.
    CPC ......... *H01M 10/486* (2013.01); *H02J 7/0048* (2020.01); *H02J 7/0063* (2013.01); *H02J 9/06* (2013.01); *H01M 2010/4278* (2013.01); *H01M 2220/10* (2013.01); *H02J 3/381* (2013.01); *H02J 7/35* (2013.01); *H02J 2300/26* (2020.01)

(58) Field of Classification Search
    USPC ....................................................... 307/115
    See application file for complete search history.

(56) References Cited

U.S. PATENT DOCUMENTS

| | | | |
|---|---|---|---|
| 2015/0145476 A1* | 5/2015 | Toya | H01M 10/441 320/109 |
| 2016/0099575 A1* | 4/2016 | Velderman | B25F 5/00 307/72 |

* cited by examiner

POWER SUPPLY DEVICE AND LOAD MONITOR

This application claims priority to PCT/JP2017/037463, filed Oct. 17, 2017, which claims priority to Japanese application 2016-204094, filed on Oct. 18, 2016. The entire contents of these applications are incorporated herein by reference in their entirety.

TECHNICAL FIELD

The present invention relates to a power supply device and a load monitor.

BACKGROUND ART

When a disaster occurs, it often happens that electric power is not supplied from the commercial power grid. On the other hand, devices driven by electric power are often used for the work for disaster recovery.

Therefore, a generator may be used. Some generators are driven by an engine of the like that operates with gasoline or the like. In addition, some generators are equipped with wheels to be movable.

PATENT DOCUMENT

[Patent Document 1] Japanese Patent Application Publication 2016-115323

Generators equipped with an engine often have a large mass, and they are difficult to move even if they have wheels. Since the battery has a large mass in accordance with the charge/discharge capacity, it is difficult to move the large-capacity battery or battery system required for the restoration work and the like.

Therefore, an object of the present invention is to make it easy to move the power supply device using a large capacity battery.

SUMMARY

According to an aspect of the present invention, there is provided a power supply device comprising: a carriage having wheels; an inverter supported by the carriage; a battery having a power output terminal at a lower part thereof; and a battery mounting portion to which the battery can be mounted and detached by moving vertically, having a power input terminal connected to the inverter and contact with the output terminal when the battery is mounted.

According to another aspect of the present invention, there is provided a power supply device comprising: a carriage having wheels; an inverter supported by the carriage; and a battery mounting portion to which a battery can be mounted and detached by moving vertically, having a power input terminal connected to the inverter and contact with the output terminal when the battery is mounted, the battery having a power output terminal at a lower part thereof.

According to another aspect of the present invention, there is provided a load monitor comprising: a first switch provided between an outlet connected to a load and the inverter; a DC power supply connected to the outlet in parallel with the inverter; a second switch provide between the DC power supply and the outlet; a first sensor detecting a current flowing between the outlet and the inverter; a second sensor detecting a current flowing between the outlet and the DC power supply; and a controller making the first switch ON, the second switch off and stop an operation of the inverter when the current detected by the first sensor is smaller than a first threshold for a predetermined period, and making the first switch OFF, the second switch ON and start an operation of the inverter when the current detected by the second sensor exceeds a second threshold.

According to the present invention, it is possible to make it easy to move the power supply device using a large capacity battery.

EMBODIMENT

An embodiment of the present invention will be described by referring to the drawings. This embodiment is only an example and the present invention is by no means limited to this embodiment. The same symbols are given to same or similar configurations, and duplicated descriptions may be omitted.

Figure 1:
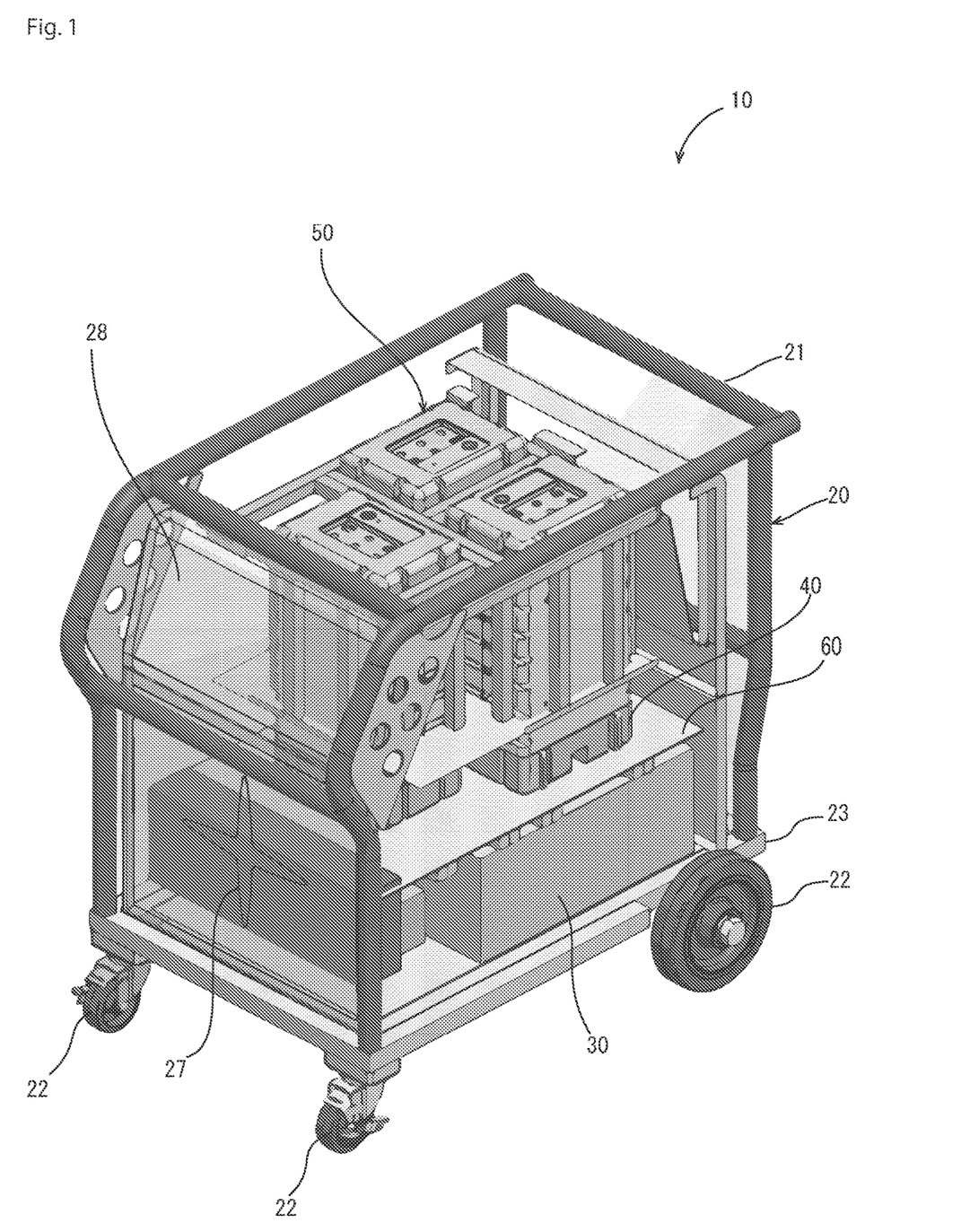
FIG. 1 is a perspective view of a power supply device according to an embodiment of the present invention.
Figure 2:
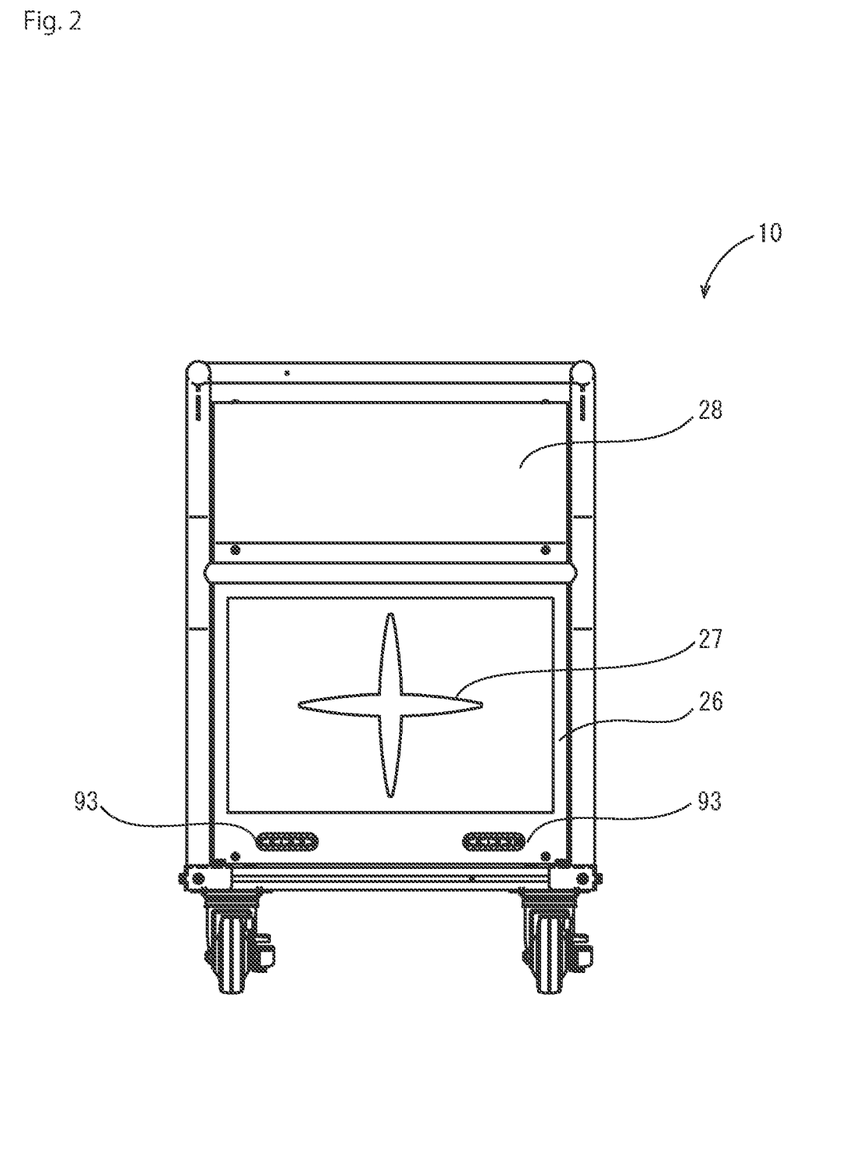
FIG. 2 is a front view of a power supply device according to an embodiment of the present invention.
Figure 3:
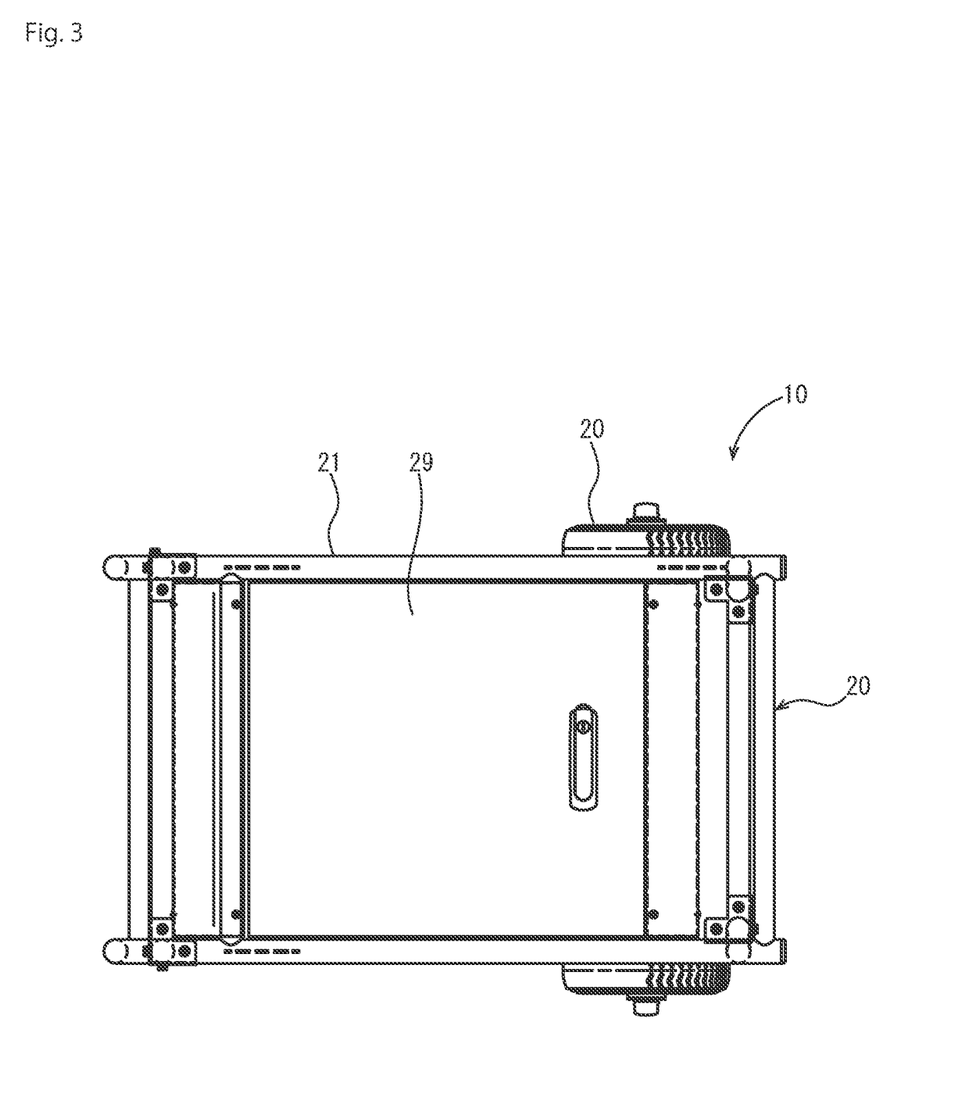
FIG. 3 is a top view of a power supply device according to an embodiment of the present invention.
Figure 4:
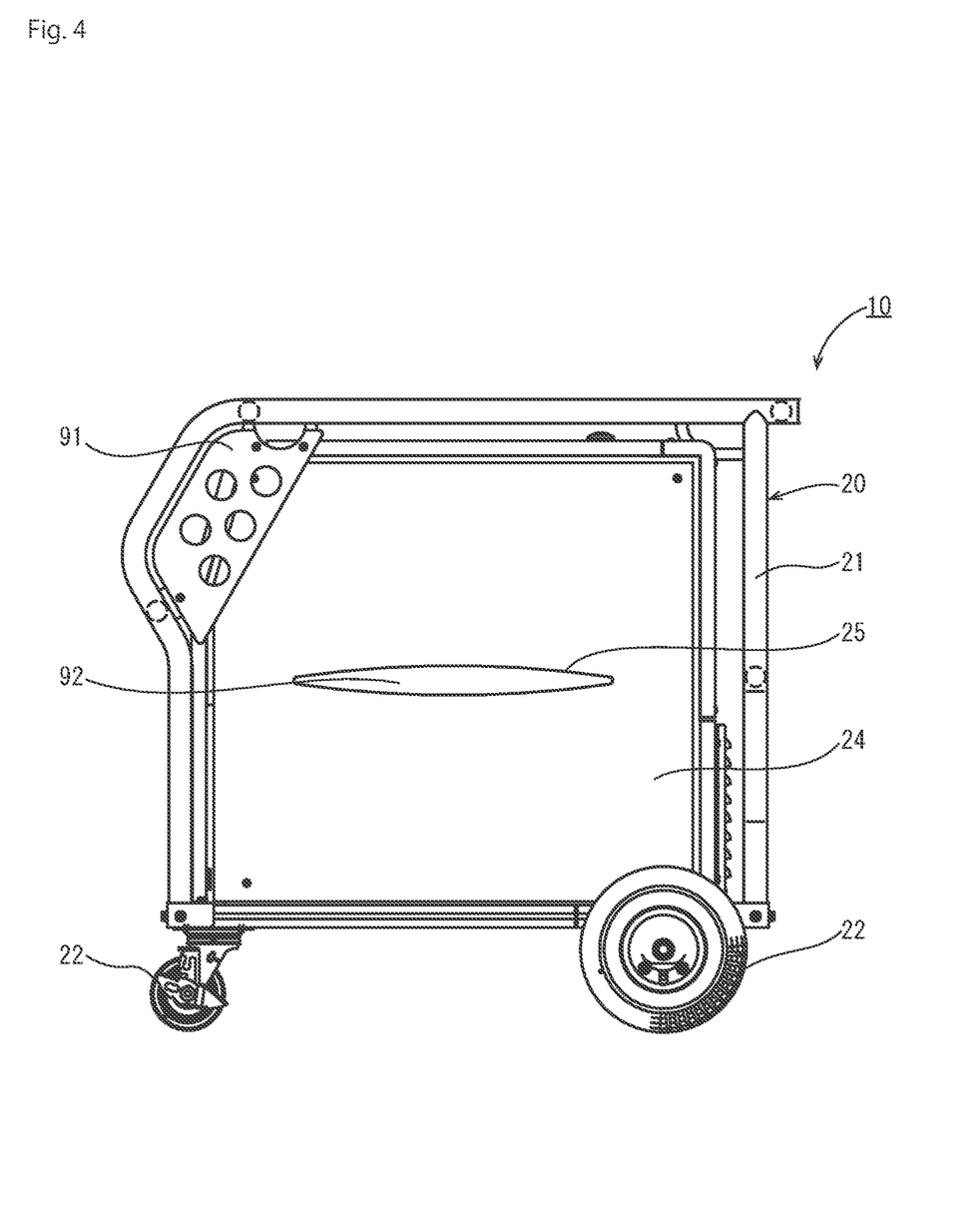
FIG. 4 is a side view of a power supply device according to an embodiment of the present invention.
Figure 5:
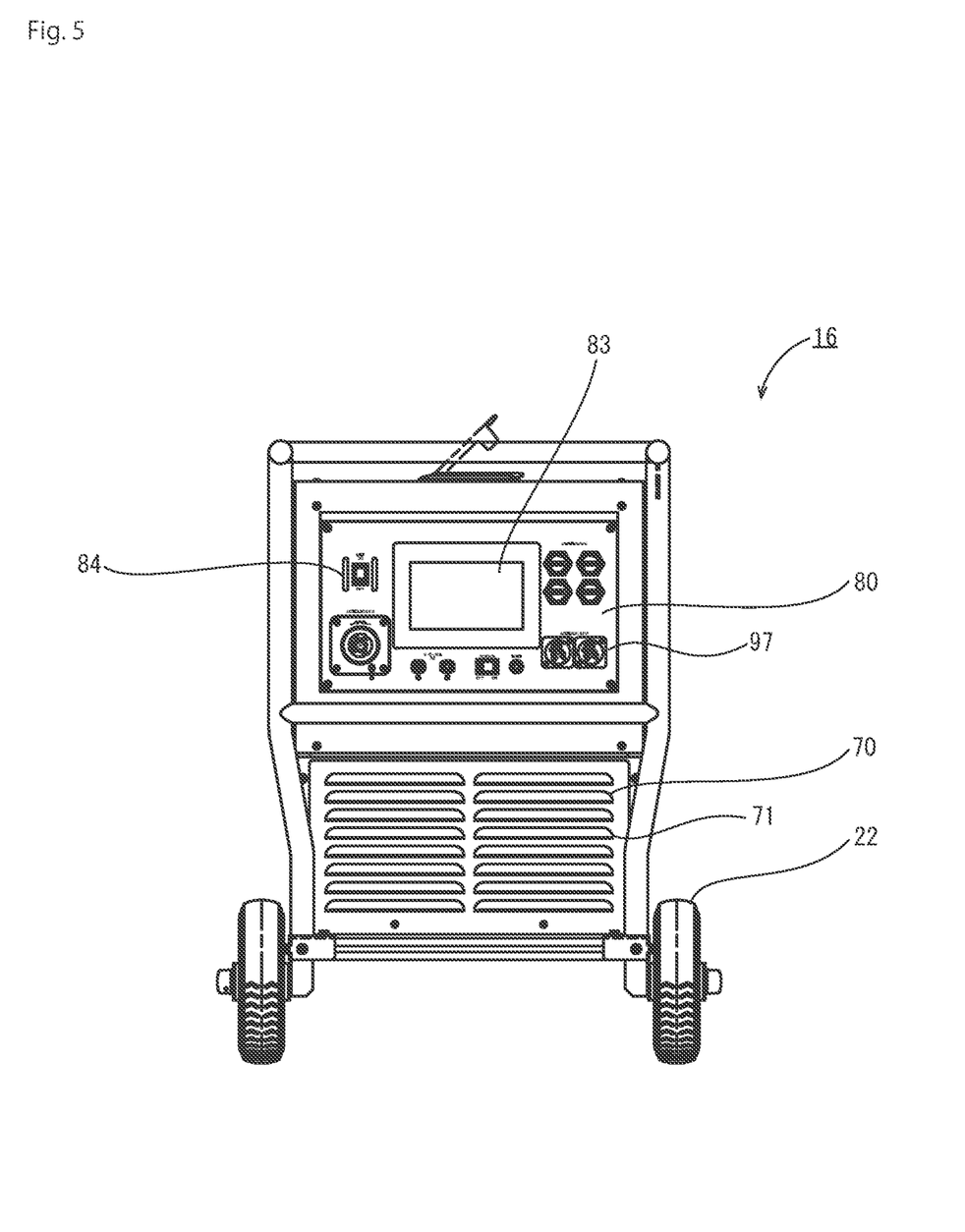
FIG. 5 is a rear view of a power supply device according to an embodiment of the present invention.

FIG. 1 is a perspective view of a power supply device according to an embodiment of the present invention. FIG. 2 is a front view of a power supply device according to the embodiment. FIG. 3 is a top view of a power supply device according to the embodiment. FIG. 4 is a side view of a power supply device according to the embodiment. FIG. 5 is a rear view of a power supply device according to the embodiment.

The power supply device 10 according to the present embodiment includes a carriage 20, an inverter 30, a battery attachment portion 40 and a battery 50.

The carriage 20 has a bottom plate 23, a frame 21, wheels 22 and a cover. The bottom plate 23 is a flat plate. The bottom plate 23 is made of stainless steel for example.

The frame 21 is formed of aluminum pipes for example. The frame 21 consists of a upper frame which is substantially rectangular and is disposed above and parallel to the bottom plate 23, and pillar portions extending from the bottom plate 23 toward the upper frame.

The number of the wheels is four for example. Two wheels are attached to each of sides at the rear of the bottom of the frame 21. Two wheels 22 are attached at the front of the bottom of the frame 21. The wheels 22 attached to the front of the bottom of the frame 21 are attached to wheel fixtures which can rotate horizontally. The wheel 22 is made of stainless steel at a central region and rubber at a peripheral region. The wheels 22 may have a stopper at front and/or rear wheel. The stopper may be operable by a handle of the carriage 20. It may be configured that it becomes unmovable if the handle of the carriage is released.

Side plates 24 are attached to the left and right side of the carriage 20. A slit 25 is formed in the side plate 24. The side plate 24 is made of stainless steel for example. A reinforcing side plate 92 may be attached to the inside of the side plate 24. In addition, reinforcing plates 91 may be attached to the left and right of the front upper portion of the carriage 20 and the like.

A front plate 26 is attached to the lower part of the front of the carriage 20. A slit 27 is formed in the front plate 26. An inclined plate 28 is attached to the upper part of the front of the carriage 20. The front plate 26 and the inclined plate 28 are made of stainless steel for example. An LED lighting 93 is attached to the lower part of the front plate 26. For example, two LED lightings 93 are provided on the left and right. Each of the LED lightings 93 has, for example, a plurality of LEDs. The LED lighting 93 emits light in parallel as much as possible with the ground, that is, in the horizontal direction. As a result, unevenness on the ground can be easily recognized. In the LED lighting 93, it is preferable that the unevenness in intensity of luminance when viewed in a plane be small.

A suction panel 70 is attached to the lower portion of the rear of the carriage 20. A suction port 71 opened downward is formed in the suction panel 70. The suction panel 70 is made of, for example, stainless steel. The inner side surface of the suction panel 70 may be provided with a filter for suppressing the entry of dust or the like. A fan is provided close to the front of the carriage 20 so as to form an air flow from the suction panel 70 toward the front of the carriage 20.

An operation panel 80 is attached to the upper part of the rear of the carriage 20. The operation panel 80 has a main switch 84, an AC outlet 97, and an LCD display 83. The operation panel 80 may be provided with a USB terminal, an AC input terminal, an input unit of a solar panel, and the like.

An upper plate 29 is attached to the top of the carriage 20. A hinge is attached to, for example, the rear end of the upper plate 29, and the upper plate 29 can be opened and closed. The upper plate 29 is made of, for example, stainless steel. When used in a place where there is no risk of getting wet, the upper plate 29 may not be provided. Alternatively, punching metal or the like may be used.

The inverter 30 is mounted on the upper surface of the bottom plate 23. The inverter 30 may be fixed to the bottom plate 23. When the inverter 30 is fixed to the bottom plate 23, the possibility of movement of the inverter 30 due to vibration while transporting or the like is reduced.

A partitioning plate 60 is provided above the inverter 30. The partitioning plate 60 is disposed in parallel to the bottom plate 23. The partitioning plate 60 is fixed directly or indirectly to the carriage 20.

A battery mounting portion 40 is provided on the upper surface of the partitioning plate 60. There are three battery attachment portions 40, for example.

A battery 50 is mounted to each of the battery attachment portions 40. The battery 50 has a substantially rectangular parallelepiped case and a plurality of storage batteries contained in the case. At the lower portion of the battery 50, a terminal portion is provided. At the top of the battery 50, a handle is attached. At the upper surface of the battery 50, an indicator for displaying the residual electricity quantity of the battery 50 may be provided.

The battery 50 is, for example, a lithium ion battery. Other types of batteries may be used as long as they are lightweight and have a large capacity. In the case of a Li-ion battery, the battery capacity can be nominally about 30,000 mAh even in the case of about 22 cm×about 16 cm×about 40 cm. In the case of this size, the mass of the battery 50 is, for example, about 12 kg.

The output voltage of battery 50 is, for example, about 43V. The output current is, for example, at a momentary maximum of about 100 A. The voltage at the time of charge is, for example, about 50V. The current at the time of charging is, for example, 24 A.

Figure 6:
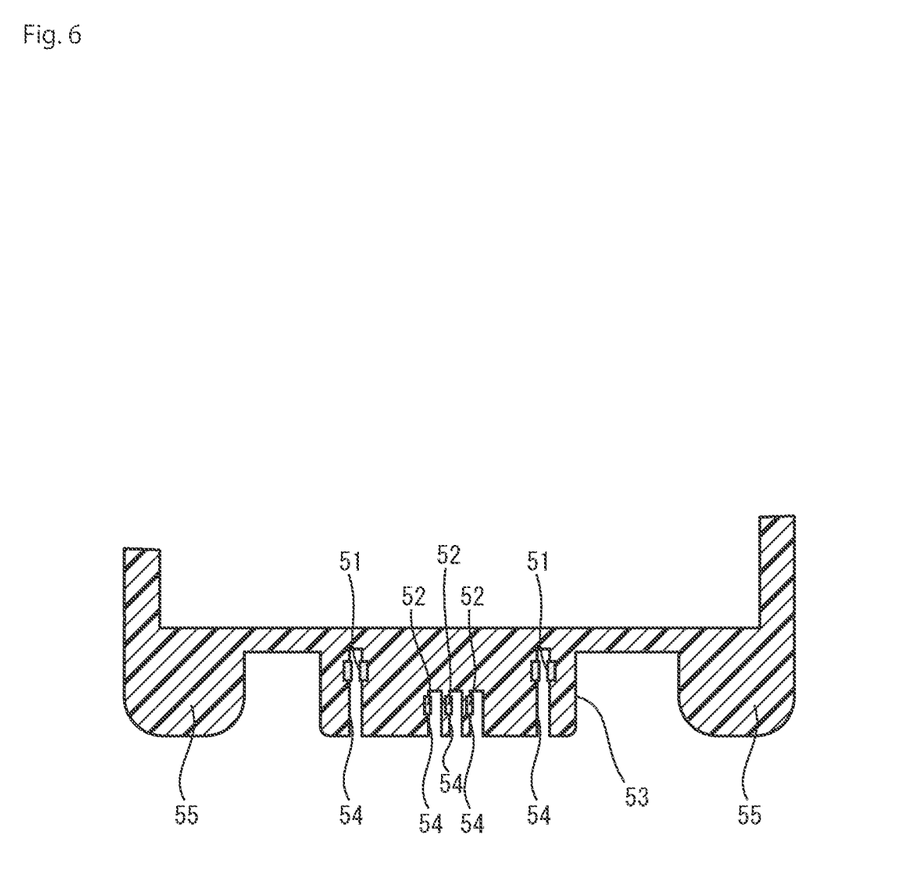
FIG. 6 is a partially enlarged cross sectional view of a battery of a power supply device according to an embodiment of the present invention.

FIG. 6 is a partially enlarged cross sectional view of a battery of a power supply device according to the embodiment.

At the bottom of the battery 50, a power output terminal 51 and a communication terminal 52 are provided. The power output terminal 51 and the communication terminal 52 are protected by a cover 53 formed integrally with the case. A cover 53 is formed as a columnar with a hole 54 for example, and the power output terminal 51 and the communication terminal 52 is provided in the middle of the holes 54. At the bottom of the battery 50, a stem 55 having the same height as the cover 53 may be provided.

The battery 50 is provided with a temperature sensor. The temperature measured by the temperature sensor is output from the communication terminal 52. The battery 50 may include a current sensor and a voltage sensor. In addition, the battery 50 may have a memory to store history data such as the number of charge and discharge times in the past.

In addition, the case of the battery 50 may be rotationally asymmetric with respect to the portion facing the battery mounting portion 40 so that the battery 50 cannot be mounted in the reverse direction.

Figure 7:
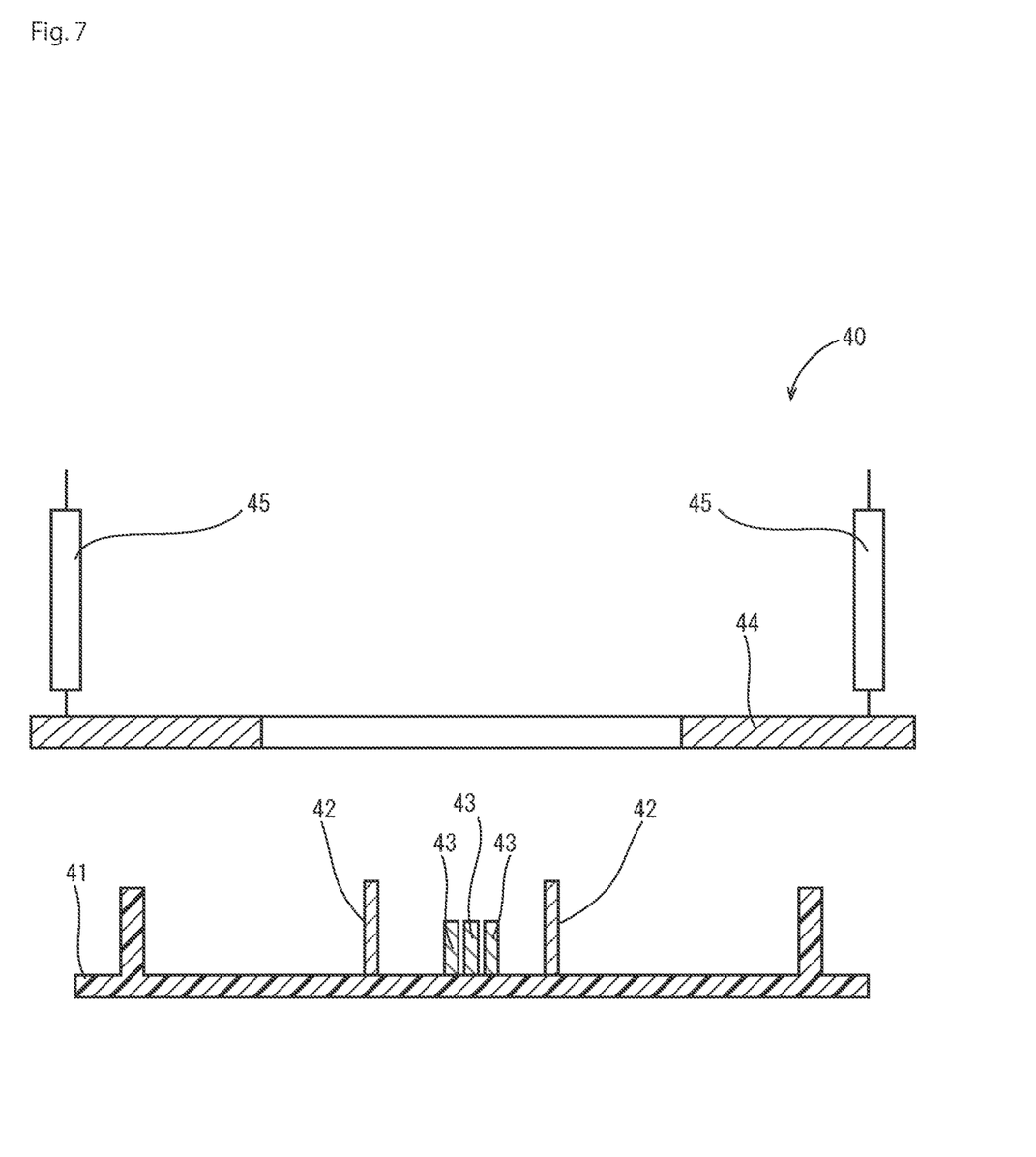
FIG. 7 is a cross sectional view of a battery mounting portion of a power supply device according to an embodiment of the present invention.

FIG. 7 is a cross sectional view of a battery mounting portion of a power supply device according to the embodiment.

The battery mounting portion 40 has a frame structure 41, a power input terminal 42 and a communication terminal 43. The frame structure 41 comprises a bottom portion and a side portion of which shape is a rectangular slightly larger than the size of the battery 50 extending upwardly from the bottom of the frame structure 41. The power input terminal 42 extends upward from the bottom of the frame structure 41. There are two power input terminals 42 per one battery mounting portion. The communication terminal 43 extends upward from the bottom of the frame structure 41. The power input terminal 42 is connected to the inverter 30. The power input terminal 42 contacts the power output terminal 51 when the battery 50 is mounted to the battery mounting portion 40. There are six communication terminals 43 per one battery mounting portion 40, for example.

The battery mounting portion 40 may include a buffer plate 44. The buffer plate 44 is supported by, for example, a hydraulic suspension 45 extending obliquely from above. The central portion of the buffer plate 44 is formed with an opening larger than the size of a cover that protects at least the power output terminal 51 and the communication terminal 52 of the battery 50. Even if the user releases the battery 50 while mounting the battery 50, the battery 50 is temporarily received by the buffer plate 44. Thereafter, with the extension of the hydraulic suspension 45 due to the weight of the battery 50, the buffer plate 44 descends slowly. Since the buffer plate 44 is slowly lowered, possibility that the battery 50 collides at a high speed to the power input terminal 42 and the communication terminal 43 is reduced.

As a result, the possibility of the battery 50 and the battery mounting portion 40 being damaged by the falling of the battery is reduced.

Figure 8:
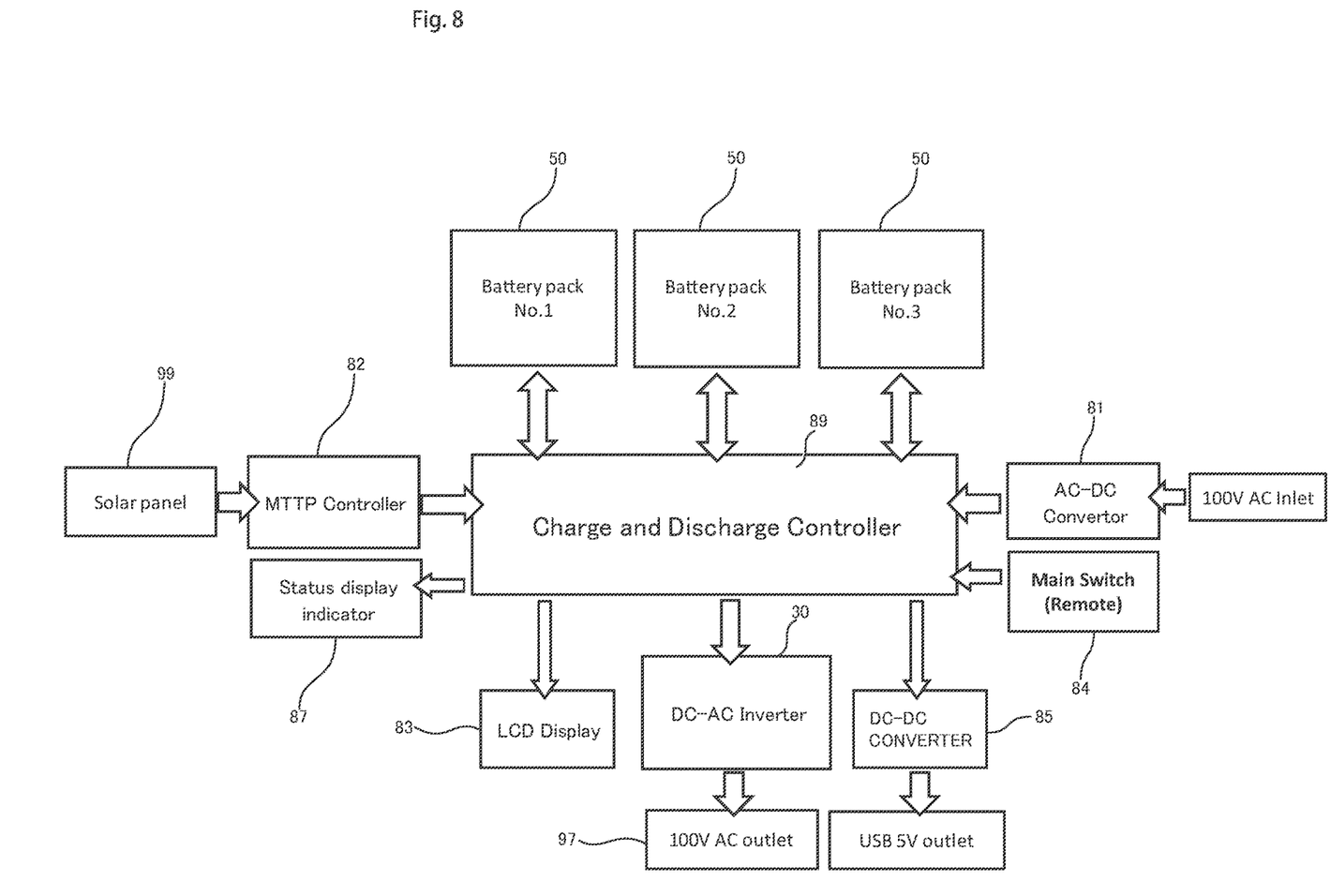
FIG. 8 is a block diagram of a power supply device according to an embodiment of the present invention.

FIG. 8 is a block diagram of a power supply device according to the embodiment.

The power supply device 10 of the present embodiment has a charge/discharge controller 89, an AC/DC converter 81, an MTTP controller 82, an LCD display 83, a main switch 84, a DC/DC converter 85, and a status indicator 87. The charge/discharge controller 89 is connected to the battery 50, the inverter 30, the AC/DC converter 81, the MTTP controller 82, the LCD display 83, the main switch 84 and the DC/DC converter 85.

The inverter 30 converts the direct current of the battery 50 to alternating current of 100 V. The alternating current converted by the inverter 30 is output from an AC outlet 97 of 100V.

The AC/DC converter 81 converts, for example, a 100 V alternating current supplied from the commercial power grid into a direct current. The DC current converted by the AC/DC converter 81 is supplied to the battery 50 via the charge/discharge controller 89 and is used to charge the battery 50.

The MTTP controller 82 is a maximum power point tracking controller. A solar panel 99 can be connected via the MTTP controller 82.

The LCD display 83 displays the status of the power supply 10. The LCD display 83 may be a touch-panel-type display and the power supply 10 may be operated via the LCD display 83.

The main switch 84 is a master switch of the power supply device 10.

The DC/DC converter 85 converts the voltage of the direct current of the battery 50. The output voltage of the battery 50 is, for example, 43 V. The output voltage of the DC/DC converter 85 is 5V. The output of the DC/DC converter 85 is supplied to an external device from, for example, a USB terminal.

The charge/discharge controller 89 has a function from a load monitor 86 (shown in FIG. 9 below). This load monitor 86 monitors whether an external device (load) connected to the inverter 30 is operating.

The status indicator 87 displays the status of the power supply 10, in particular, the remaining charge amount of the battery 50. The status indicator 87 has a light disposed inside the side plate 24 close to the slit 25 formed on the side plate 24 of the carriage 20.

Figure 9:
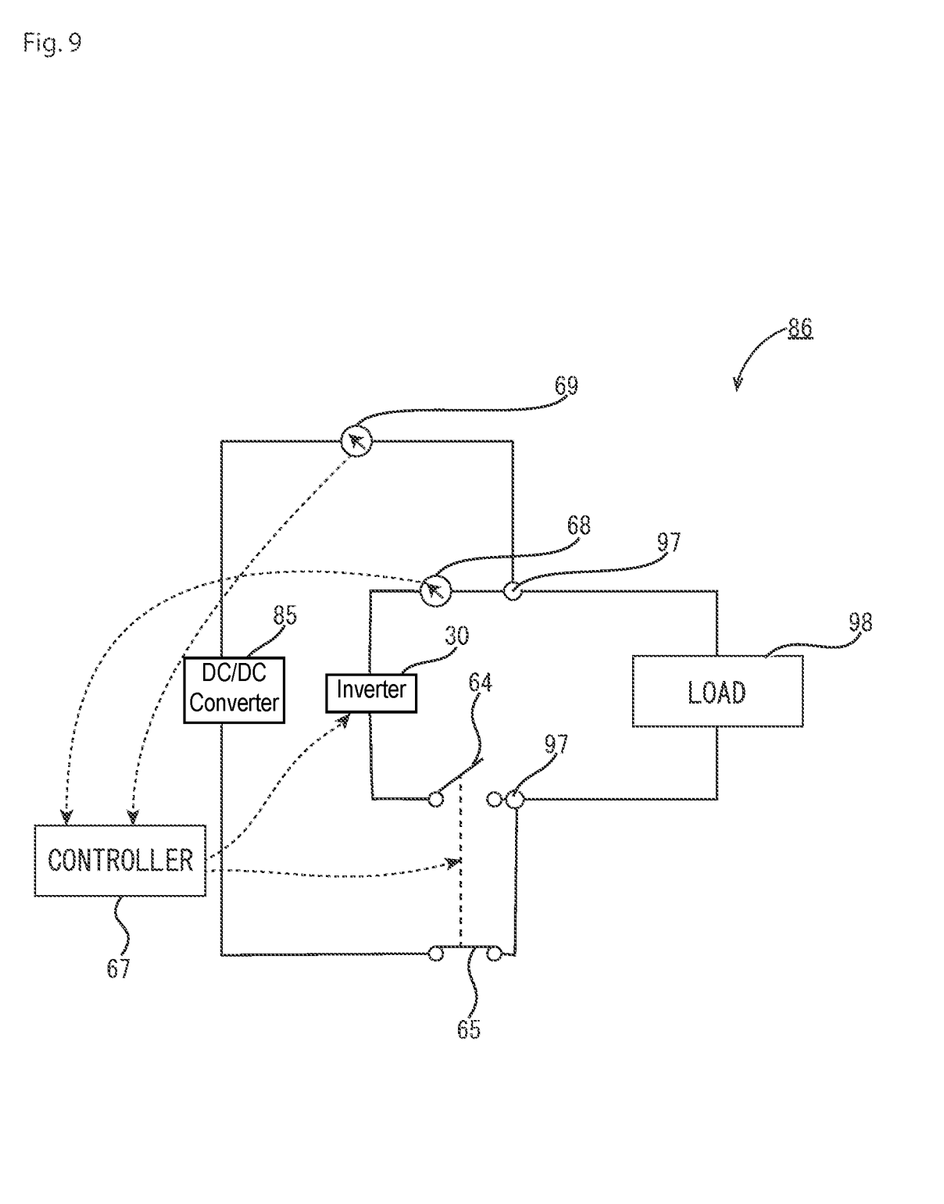
FIG. 9 is a circuit diagram of a power monitor of a power supply device according to an embodiment of the present invention.

FIG. 9 is a circuit diagram of a power monitor of a power supply device according to the embodiment.

The load monitor 86 includes a first sensor 68, a second sensor 69, a controller 67, a first switch 64 and a second switch 65. The first switch 64 is provided between the AC outlet 97 and the inverter 30.

The DC/DC converter 85 and the AC outlet 97 are connected such that the DC/DC converter 85 and the inverter 30 are in parallel. The second switch 65 is provided between the DC/DC converter 85 and the AC outlet 97. The first switch 64 and the second switch 65 are interlocked, and only one of them can be closed (ON).

The first sensor 68 measures the current that the inverter 30 outputs and flows through the load. The second sensor 69 measures the current that the DC/DC converter 85 outputs and flows through the load 98 via the AC outlet 97.

The controller 67 of the load monitor 86 receives the current value measured by the first sensor 68 and monitors whether the current is supplied to the load 98 from the inverter 30. While the current is supplied to the load 98, it closes the first switch 64. At this time, the second switch 65 is in the open state.

When the load 98 is not imposed for a predetermined period, i.e., the current value measured by the first sensor 68 is equal to or less than a predetermined threshold value, and, remain so for the predetermined time, the controller 67 opens the first switch 64. At this time, the second switch 65 becomes closed. The threshold value of the current may be a value that can guarantee that the load 98 is not substantially imposed. The predetermined time is determined in consideration of the power consumption when the inverter 30 is booted.

Next, the operation of the power supply device 10 according to the present embodiment will be described.

First, the main switch 84 is turned ON to activate the power supply device 10. The power supply 10 may have an auxiliary battery so as to be operated without the battery 50.

Connecting the AC/DC converter 81 to the commercial power system, charge/discharge controller 89 charges the battery 50, based on the information on the remaining charge of the battery 50, if necessary, by controlling the AC/DC converter 81.

Connecting the solar panels 99 to the power supply 10, MTTP controller 67 charges to battery 50 efficiently as the voltage of the solar panel 99.

In case of emergency, the power supply device 10 is moved to a position where electric power is required, for example, by pushing the carriage 20 by a person. While moving of the power unit 10 to uphill for example, unmounting the battery 50 from the carriage 20 reduces the weight of the carriage 20 and makes it easy to move. The battery 50 is separated from the carriage 20 and transported as lifted by gripping and pulling the up the handle provided at the top of the battery 50.

After the power supply 10 reaches to a position where power is required, the battery 50 is mounted to the battery mounting portion 40 if the battery 50 is removed. Since the battery 50 becomes heavy as the charge and discharge capacity increases, removing and mounting the battery 50 needs power and is dangerous.

In this embodiment of the power supply device 10, the battery 50 is removed from and mounted to the battery mounting portion 40 by moving in the vertical direction. Therefore, when the battery 50 is mounted, the user only needs to move the battery 50 down gently after moving and positioning the battery 50 horizontally.

For example, if the battery is mounted by moving it in the horizontal direction, it is necessary to move the battery while positioning it in the vertical direction while lifting or pushing up. Because of this, if the battery is heavy, it is very difficult. Further, if the battery is mounted by moving it in the horizontal direction, it is necessary to support it to avoid the battery fallen downwardly at the moment when no longer support such as carriage while removing the battery.

However, in this embodiment, while attaching and detaching the battery 50, it is only necessary to move the battery 50 up and down. Therefore, the battery 50 can be easily attached and detached, and the risk of injury to the user or damage to the device due to falling of the battery 50 during the attachment or detachment can be reduced.

When at least one battery 50 is mounted to the power supply 10 and the inverter 30 is activated, an AC current of 100 V is supplied from the AC outlet 97 to the load 98. When the plurality of batteries 50 are mounted to the battery mounting portion 40, power may be supplied from all of the batteries 50 to the inverter 30, or power may be supplied from one by one.

When the temperature of the battery 50 is out of the specific temperature range, the discharge performance is degraded. The specific temperature range is, for example, about 0 degree C. to 60 degree C. More preferably, the specific temperature range is about 20 degree C. to 25 degree C. While the outside air temperature merely exceeds the operating temperature specification of the battery 50, that the outside air temperature may often be below the operating temperature specification of the battery 50. For example, when a disaster occurs in a cold district, the outside air temperature may be considerably low in case that the power supply 10 has to be used outside a building.

However, in the present embodiment, the battery 50 is disposed above the inverter 30. During the power conversion, the inverter 30 loses energy to some extent and generates heat. The heat generated by the inverter 30 is transmitted to the battery 50 located above the inverter 30. As a result, when power is supplied from the battery 50 to the outside through the inverter 30, the temperature of the battery 50 rises. Therefore, when the battery 50 starts discharging and a certain amount of time passes, the temperature of the battery 50 rises, and it becomes possible to discharge in a state where the residual charge is difficult to discharge at a low temperature state. That is, in the present embodiment, the charge and discharge performance of the battery 50 can be further exhibited.

Further, in the present embodiment, the inverter 30 is housed in the area surrounded by the side plate 24 and the like. Therefore, the possibility of the user being burned by the heat of the inverter 30 is suppressed. Also, if the auxiliary plate 92 is provided inside of the side plate 24, an air layer is formed between the side plates 24 and the auxiliary side plate 92 and it improves the heat insulating property and the possibility of the user being burned is further suppressed.

If the temperature of the battery 50 is likely to be excessively high, the temperature of the inverter 30 is reduced by rotating the fan to suck outside air from the suction panel 70 and discharging it from the front, and as a result, the temperature of the battery 50 can also be reduced. Since the flow of air by the fan is from the rear to the front, even when the user is operating the operation panel 80, the exhaust does not go to the user.

When the heat radiation performance is important, for example, when used in a hot place, a heat radiation fin may be provided on the lower portion of the bottom plate 23 of the carriage 20. The heat dissipating fins may be removable.

When the remaining charge of the battery charge 50 is substantially eliminated, i.e., is less than a predetermined remaining amount of charge, charge/discharge controller 89 stops the supply of electric power from such battery 50 to the inverter 30 and switches so that electric power is supplied to the inverter 30 from the other battery 50. As a result, even when the power supply device 10 is in operation, the battery 50 whose remaining charge amount is exhausted can be removed from the battery mounting portion 40.

The status indicator 87 displays the status by light leaked from the slits 25 formed in the side plates 24 and the slit 27 formed in the front plate 26. Furthermore, the status indicator 87 may provide with a light on the bottom surface of the bottom plate to indicate the status using light projected onto the ground. Here, the state is, for example, the remaining charge amount of the battery 50. It expresses that the remaining charge amount of the battery 50 is sufficient, medium, insufficient, or the like by the blinking speed, the color and/or the like.

For example, when the remaining battery charge 50 is sufficient, the status indicator 87 displays as emission intensity varies with 1/f fluctuation. By setting the emission intensity to vary with 1/f fluctuation, the user who saw it feels a sense of security. Therefore, it is possible to recognize that there is no problem in the power supply device 10 without reading the instruction manual etc.

On the other hand, except when the remaining charge amount of the battery 50 is sufficient, by making the change of the light emission intensity deviate from the 1/f fluctuation, it is possible that the user who saw it recognize some problem. For example, when the remaining charge amount of the battery 50 is almost exhausted, the user can sense that a problem has occurred by repeating blinking at a relatively early cycle.

As a result, even if the user is away from the power supply 10, the user can roughly grasp the state of the power supply 10. Only when there is a problem such as a insufficient remaining charge amount, it is only necessary to approach the power supply 10 and take appropriate measures. Therefore, if there is no particular problem, the user may be located away from the power supply 10. As a result, the situation in which the user's work such as disaster recovery has to be interrupted is reduced.

Further, the load monitor 86 is provided and the operation of the inverter 30 ceases when it continues for a certain period that the load 98 is not operating. Therefore, the user can suppress the consumption of the battery 50 without turning ON/OFF the operation of the inverter 30. As a result, even when working at a position away from the power supply 10, the battery 50 can be used for a longer time.

EXPLANATION OF REFERENCE SYMBOLS

10: power supply device, 20: carriage, 21: frame, 22: wheel, 23: bottom plate, 24: side plate, 25: slit, 26: front plate, 27: slit, 28: inclined plate, 29: upper plate, 30: inverter, 40: battery mounting portion, 41: frame structure, 42: power input terminal, 43: communication terminal, 44: buffer plate, 45: hydraulic suspension, 50: battery, 51: power output terminal, 52 communication terminal, 53: cover, 54: hole, 55: stem, 60: partitioning plate, 64: first switch, 65: second switch, 67: controller, 68: first sensor, 69: second sensor, 70: suction panel, 71: suction port, 80: operation panel, 81: AC/DC converter, 82: MTTP controller, 83: LCD display, 84: main switch, 85: DC/DC converter, 86: load monitor, 87: status indicator, 89: charge/discharge controller, 91: reinforcing plate, 92: reinforcing side plate, 93: LED lighting, 97: AC outlet, 93: load, 99 solar panel

The invention claimed is:
1. A power supply device comprising:
a carriage having wheels;
an inverter supported by the carriage;
a battery having a power output terminal at a lower part thereof;
a battery mounting portion to which the battery can be mounted and detached by moving vertically, having a power input terminal connected to the inverter and contact with the power output terminal when the battery is mounted; and
a load monitor having
a first switch provided between an outlet connected to a load and the inverter;

a DC power supply connected to the outlet in parallel with the inverter;
a second switch provide between the DC power supply and the outlet;
a first sensor detecting a current flowing between the outlet and the inverter;
a second sensor detecting a current flowing between the outlet and the DC power supply; and
a controller configured to:
when the current detected by the first sensor is smaller than a first threshold for a predetermined period, making the first switch OFF, making the second switch ON, and stopping an operation of the inverter, and
when the current flows to the load, making the first switch ON, making the second switch OFF, and starting the operation of the inverter.

2. The power supply device according to claim 1, wherein the battery mounting portion is disposed above the inverter.

3. The power supply device according to claim 1,
wherein the battery has a sensor detecting a temperature and a communication terminal outputting information on a temperature detected by the sensor, and
further comprising:
a fan cooling the inverter; and
a control device controlling a rotation speed of the fan depending on the temperature of the battery.

4. The power supply device according to claim 1, further comprising:
a lighting; and
a control device controlling a light emission intensity to fluctuate with 1/f fluctuation when remaining charge of the battery is equal to or more than a predetermined threshold and controlling a light emission intensity to fluctuate as deviating from 1/f fluctuation when less than the predetermined threshold.

5. A power supply device comprising:
a carriage having wheels;
an inverter supported by the carriage;
a battery mounting portion to which a battery can be mounted and detached by moving vertically, the battery having a power output terminal at a lower part thereof, the battery mounting portion having a power input terminal connected to the inverter and configured to contact the power output terminal of the battery when the battery is mounted; and
a load monitor having
a first switch provided between an outlet connected to a load and the inverter;
a DC power supply connected to the outlet in parallel with the inverter;
a second switch provide between the DC power supply and the outlet;
a first sensor detecting a current flowing between the outlet and the inverter;
a second sensor detecting a current flowing between the outlet and the DC power supply; and
a controller configured to:
when the current detected by the first sensor is smaller than a first threshold for a predetermined period, making the first switch OFF, making the second switch ON, and stopping an operation of the inverter, and
when the current flows to the load, making the first switch ON, making the second switch OFF, and starting the operation of the inverter.

6. A load monitor comprising:
a first switch provided between an outlet connected to a load and an inverter;
a DC power supply connected to the outlet in parallel with the inverter;
a second switch provide between the DC power supply and the outlet;
a first sensor detecting a current flowing between the outlet and the inverter;
a second sensor detecting a current flowing between the outlet and the DC power supply; and
a controller configured to:
when the current detected by the first sensor is smaller than a first threshold for a predetermined period, making the first switch OFF, making the second switch ON, and stopping an operation of the inverter, and
when the current flows to the load, making the first switch ON, making the second switch OFF, and starting the operation of the inverter.

7. The power supply device according to claim 1,
wherein the battery has a sensor detecting a temperature and a communication terminal outputting information on a temperature detected by the sensor, and
further comprising:
a fan cooling the inverter; and
a control device controlling a rotation speed of the fan depending on the temperature of the battery.

8. The power supply device according to claim 7, further comprising:
a lighting; and
a control device configured to control a light emission intensity to fluctuate with 1/f fluctuation when remaining charge of the battery is equal to or more than a predetermined threshold and configured to control the light emission intensity to fluctuate as deviating from 1/f fluctuation when less than the predetermined threshold.

* * * * *